US008441255B1

(12) United States Patent
Davis et al.

(10) Patent No.: US 8,441,255 B1
(45) Date of Patent: May 14, 2013

(54) THERMOCOOLING OF GMR SENSORS

(75) Inventors: Despina Davis, Minden, LA (US);
Ramya Bellamkonda, Ruston, LA (US);
Raja Sekharam Mannam, Ruston, LA (US)

(73) Assignee: Louisiana Tech University Research Foundation, a divison of Louisiana Tech University Foundation, Inc., Ruston, LA (US)

( * ) Notice: Subject to any disclaimer, the term of this patent is extended or adjusted under 35 U.S.C. 154(b) by 776 days.

(21) Appl. No.: 12/692,280

(22) Filed: Jan. 22, 2010

Related U.S. Application Data

(60) Provisional application No. 61/146,579, filed on Jan. 22, 2009.

(51) Int. Cl.
*G01R 33/02* (2006.01)

(52) U.S. Cl.
USPC ...... 324/224; 324/252; 324/207.21; 324/260; 33/315; 33/316; 33/355 R; 33/357; 702/130; 702/136; 977/762; 977/953

(58) Field of Classification Search ............ 324/252, 324/207.21, 244, 260; 33/315, 316, 355 R–357; 702/130, 136; 997/762, 953
See application file for complete search history.

(56) References Cited

U.S. PATENT DOCUMENTS

| 6,105,381 A | 8/2000 | Ghoshal | |
|---|---|---|---|
| 6,809,516 B1* | 10/2004 | Li et al. | 324/260 |
| 6,987,650 B2 | 1/2006 | Liu et al. | |
| 7,098,393 B2* | 8/2006 | Fleurial et al. | 136/240 |
| 7,189,435 B2* | 3/2007 | Tuominen et al. | 427/472 |
| 7,190,049 B2* | 3/2007 | Tuominen et al. | 257/618 |
| 7,265,375 B2* | 9/2007 | Zhang et al. | 257/15 |
| 7,572,669 B2* | 8/2009 | Tuominen et al. | 438/99 |
| 7,891,102 B2* | 2/2011 | Peczalski | 33/355 R |
| 7,926,193 B2* | 4/2011 | Peczalski | 33/355 R |
| 2002/0055239 A1* | 5/2002 | Tuominen et al. | 438/466 |
| 2002/0158342 A1* | 10/2002 | Tuominen et al. | 257/784 |
| 2002/0172820 A1* | 11/2002 | Majumdar et al. | 428/357 |
| 2002/0175408 A1* | 11/2002 | Majumdar et al. | 257/734 |
| 2003/0047204 A1* | 3/2003 | Fleurial et al. | 136/200 |
| 2005/0161662 A1* | 7/2005 | Majumdar et al. | 257/18 |
| 2006/0177660 A1* | 8/2006 | Kumar et al. | 428/403 |
| 2007/0200477 A1* | 8/2007 | Tuominen et al. | 313/309 |
| 2010/0024231 A1* | 2/2010 | Peczalski | 33/355 R |

(Continued)

OTHER PUBLICATIONS

Spallas et al., "Improved Performance of Cu-Co CPP GMR Sensors", IEEE Transactions on Magnetics, vol. 33, No. 5, Sep. 1997, pp. 3391-3393.*

(Continued)

*Primary Examiner* — Patrick Assouad
*Assistant Examiner* — Lamarr Brown
(74) *Attorney, Agent, or Firm* — Jones Walker LLP

(57) ABSTRACT

A thermoelectrically cooled GMR sensor having a first thermoelectric layer with an array of nanowires, wherein the nanowires include a diameter of about 1 nanometer to about 1000 nanometers. A plurality of alternating layers of magnetic and nonmagnetic material are positioned over and extend the nanowires to form a GMR assembly. A second thermoelectric layer is positioned over the GMR assembly and extends the nanowires, such that the nanowires have a length of between about 100 nanometers and about 500 microns. Conductors are placed in contact with the first and second thermoelectric layers for connecting the thermoelectric layers to a voltage source.

19 Claims, 15 Drawing Sheets

U.S. PATENT DOCUMENTS

| | | | |
|---|---|---|---|
| 2010/0223797 A1* | 9/2010 | Peczalski | 33/355 R |
| 2011/0253982 A1* | 10/2011 | Wang et al. | 257/24 |
| 2012/0247527 A1* | 10/2012 | Scullin et al. | 136/227 |
| 2012/0322164 A1* | 12/2012 | Lal et al. | 436/501 |

OTHER PUBLICATIONS

Anguelouch et al., "Detection of Ferromagnetic Nanowires Using GMR Sensors", IEEE Transactions on Magnetics, vol. 40, No. 4, Jul. 2004, pp. 2997-2999.*

Miizuguchi et al., "Characteristics of NiFe/CuNi MultilayerGMR Sensors for Vertical GMR Heads", IEEE Transactions on Magnetics, vol. 34, No. 4, Jul. 1998, pp. 1504-1506.*

Yoo et al., "Site-Specific Magnetic Assembly of Nanowires for Sensor Arrays Fabrication", IEEE Sensors 2006, Oct. 2006, pp. 588-591.*

Raja Mannam, Mangilal Agarwal, Amitava Roy, Varshni Singh, Kody Varahramyan and Despina Davis. Electrodesposition and Thermoelectric Characterization of Bismuth Telluride Nanowires. Journal of The Electrochemical Society, vol. 156, No. 8, pp. B871-B875 (2009)—The Electrochemical Society Manuscript submitted Feb. 24, 2009. Published May 21, 2009.

Raja Mannam, Avinash Kola, Mangilal Agarwal, Varshini Singh, Amitava Roy, David Young, Kody Varahramyan, Despina Davis. Bismuth Telluride Nano-Coolers for Magnetic Sensors The Electrochemical Society—ECS Transactions, vol. 13, Issue 10, May 18, 2008, Phoenix, Arizona (USA) pp. 141-147.

Raja Mannam, Mangilal Agarwal, Amitava Roy, Varshini Singh, Kody Varahramyan, Despina Davis Novel Thermoelectric Cooling of Magnetic Sensors The Electrochemical Society—ECS Transactions, vol. 16, Issue 45, Oct. 12, 2008, Honolulu, Hawaii (USA) pp. 227-232.

Doriane Del Frari, Sebastien Diliberto, Nicholas Stein Clotilde Boulanger, and Jean-Marie Lecuire. Comparative study of the electrochemical preparation of $Bi_2Te_2$, $Sb_2Te_3$, and $(Bi_xSb_{1-x})_2Te_3$ films. Science Direct—Thin Solid Films 439 (2005) 44-49; accepted in revised form Dec. 7, 2004. Available online Feb. 2, 2005.

Feng Xiao, Bongyoung Yoo, Kuy-Hwan Lee and Nosang V Muyng. Electro-transport studies of electrodepostited $(Bi_{1-x}Sb_x)_2Te_3$ nanowires. IOP Publishing Ltd. 2007; Nanotechnology 18 (2007) 335203 (5pp).

Marisol Martin-Gonzalez, Amy L. Prieto, Ronald Gronsky, Timothy Sands, and Angelica M. Stacy. High-Density 40 nm Diameter Sb-Rich $Bi_{2-x}Sb_xTe_3$ Nanowire Arrays. Advanced Materials—Adv. Mater. 2003, 15 No. 12, Jun. 17, 2003 Wiley-VCH Verlag GmbH & Co. KGaA. Weinheim.

Doriane Del Frari, Sevastien Diliberto, Nicolas Stein, Clotilde Boulanger, and Jean-Marie Lecuire. Pulsed electrodeposition of $(Bi_{1-x}Sb_x)_2Te_3$ thermoelectric thin films. Journal of Applied Electrochemistry (2006) 36:449-454: accepted in revised form Nov. 1, 2005; Springer 2005.

Poster entitled, "Bismuth Telluride Nano-Coolers for Magnetic Sensors" and present at 213th ECS Meeting, Phoenix, Arizona, May 18-22, 2008.

* cited by examiner

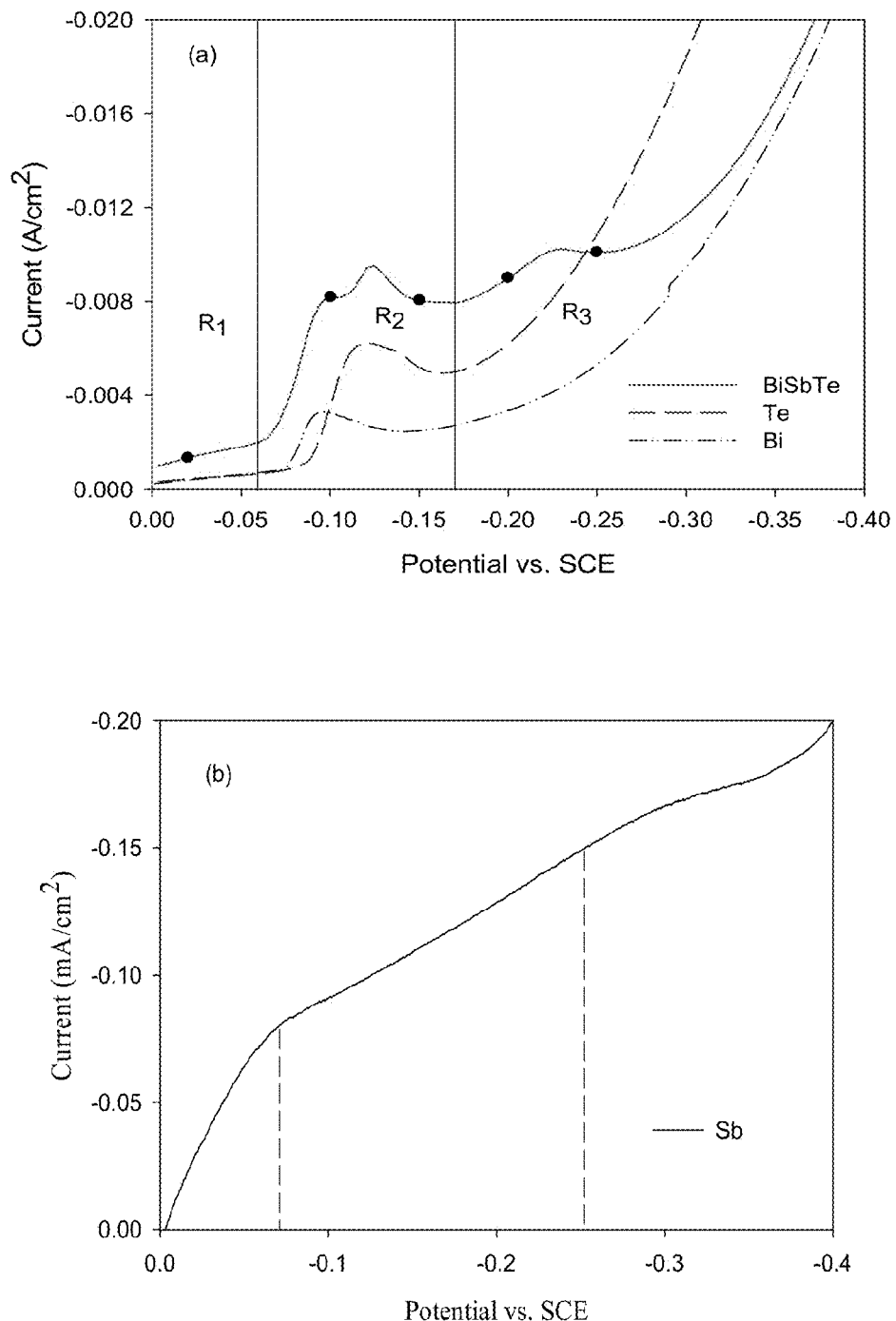
Figure 2. (a) Polarization plot of $Bi^{3+}$, $HTeO_2^+$, and the combined BiSbTe solution, (b) $SbO^+$ partial current.

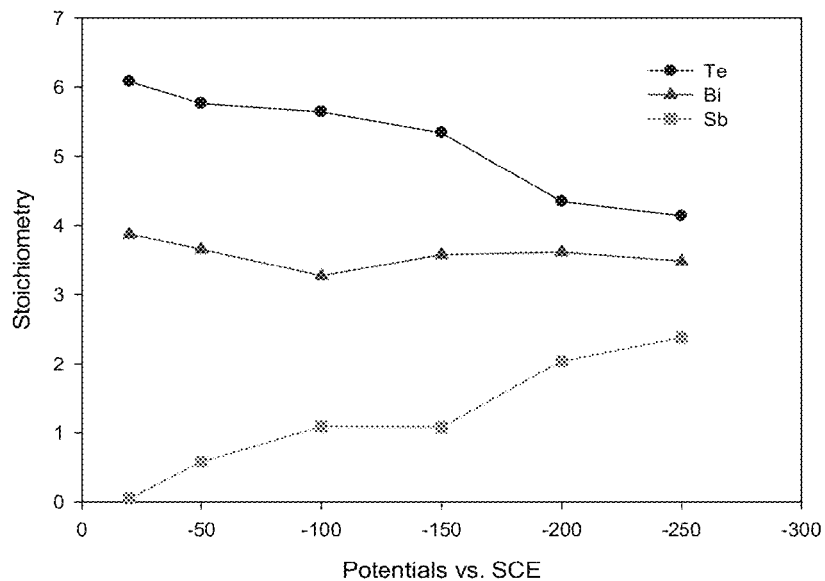
Figure 3. Plot showing the stoichiometric Bi, Te, Sb ratios in the deposited alloy with respect to deposition potential vs SCE.
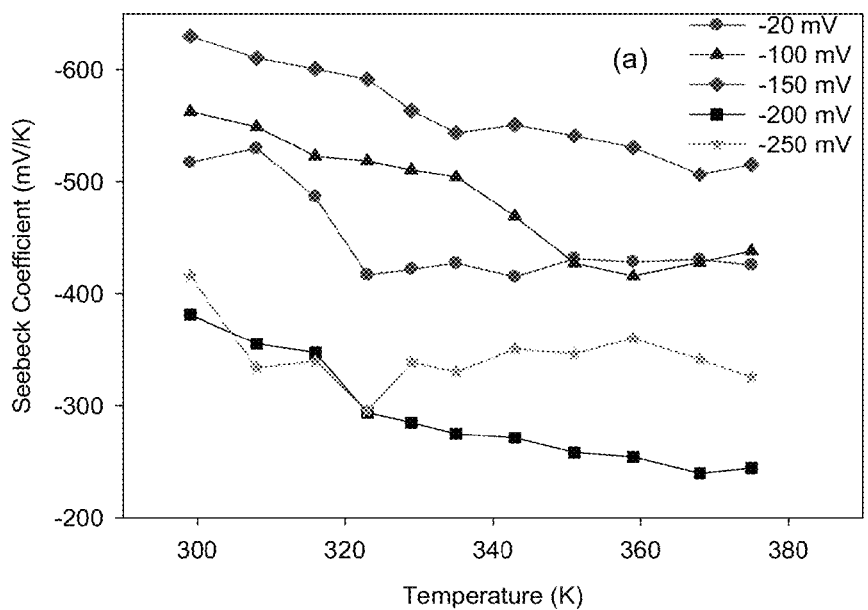
Figure 4(a). Measurements of Seebeck coefficient of BiSbTe nanowires with respect to temperature.

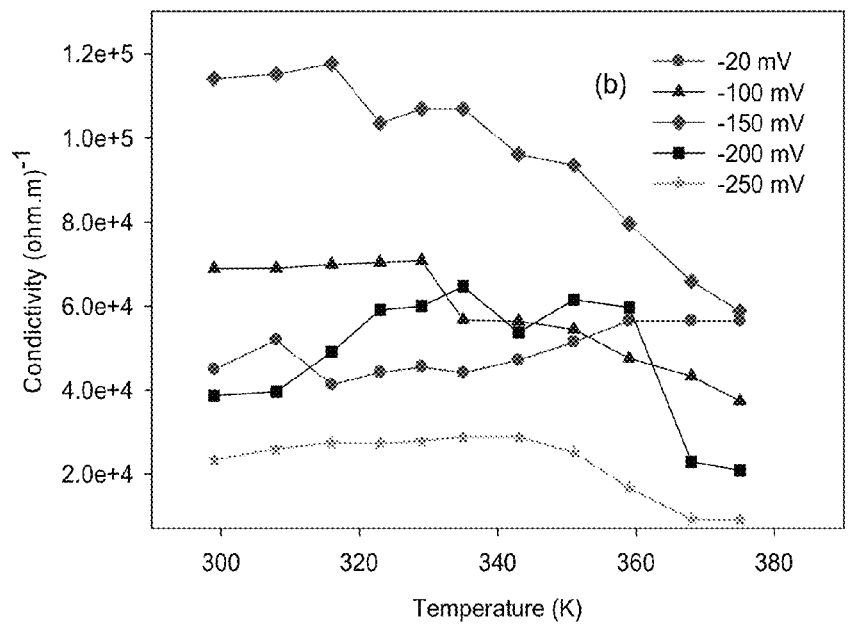
Figure 4(b). Measurements of electrical conductivity of BiSbTe nanowires with respect to temperature.
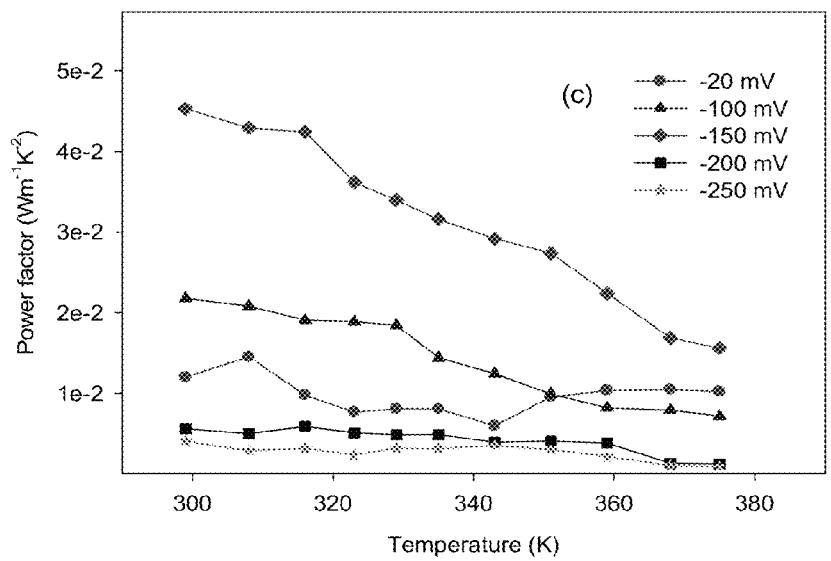
Figure 4(c). Measurements of power factor of BiSbTe nanowires with respect to temperature.

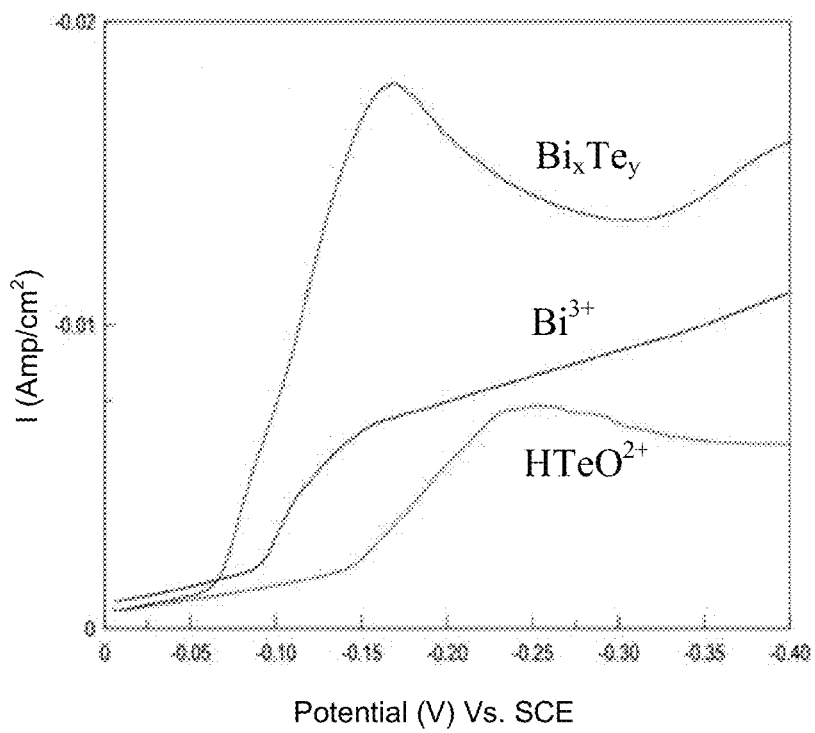
Figure 5a. Polarization plot of individual $Bi^{3+}$, $HTeO^{2+}$ and combined $Bi_XTe_Y$ electrolytes.
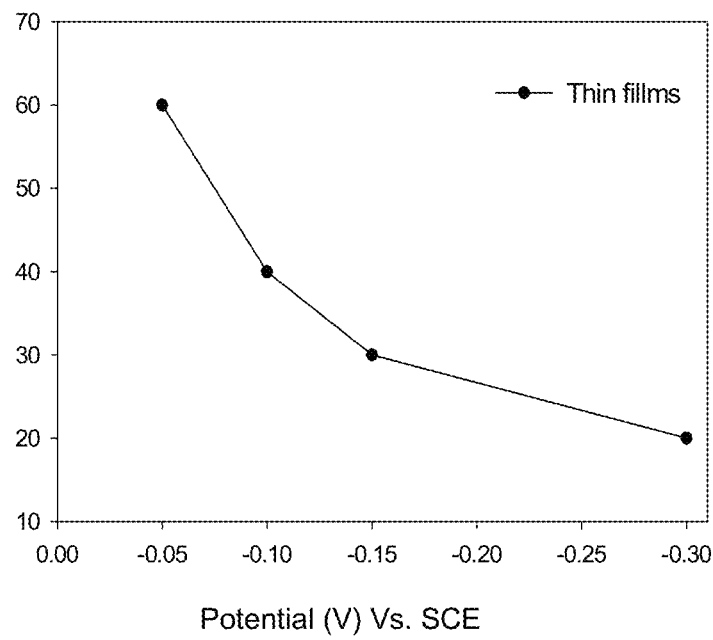
Figure 5b. Variation of Te concentration with deposition potential.

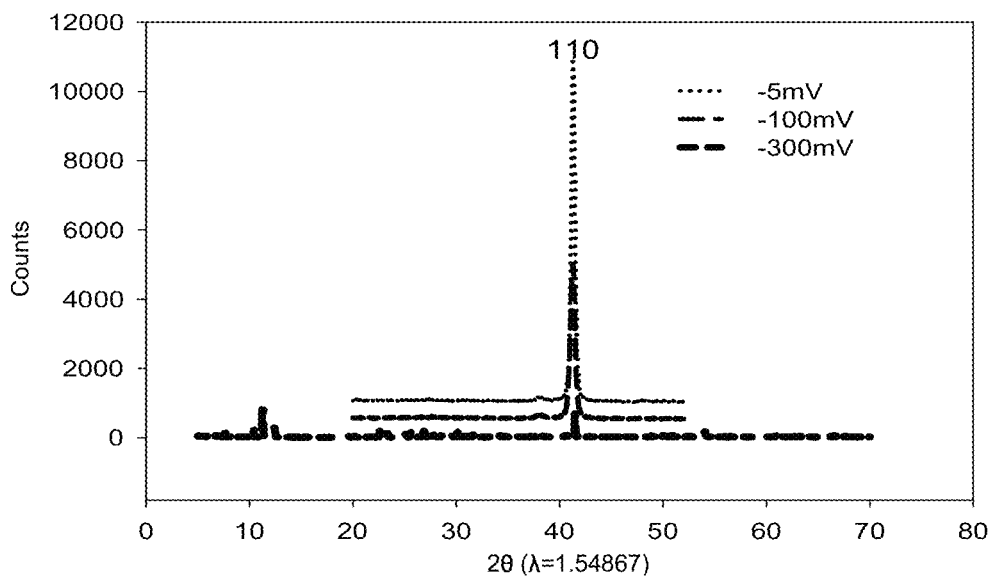
Figure 6. XRD of $Bi_xTe_y$ nanowires deposited in AAO membranes at different potentials
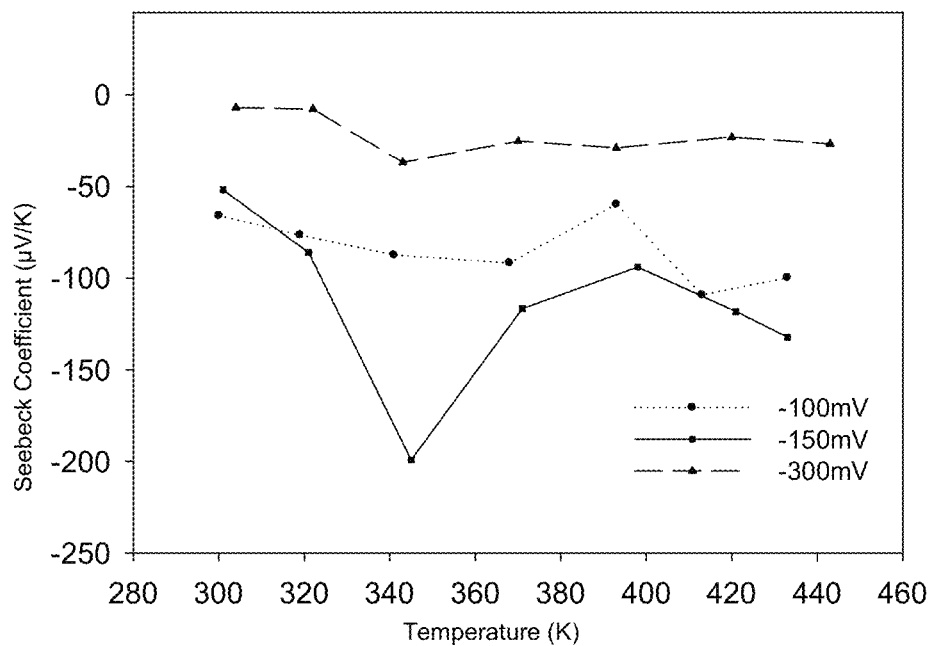
Figure 7. Seebeck coefficient of $Bi_xTe_y$ thin films measured at various temperatures.

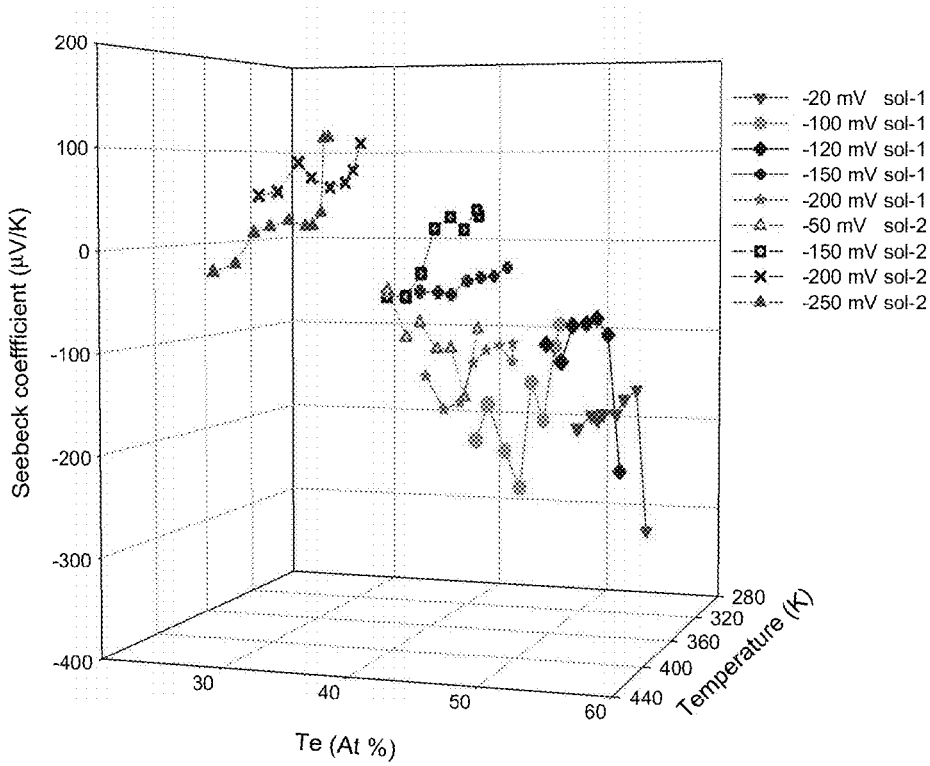
Figure 8. Seebeck coefficient variation with respect to Tellurium concentration and Temperature.
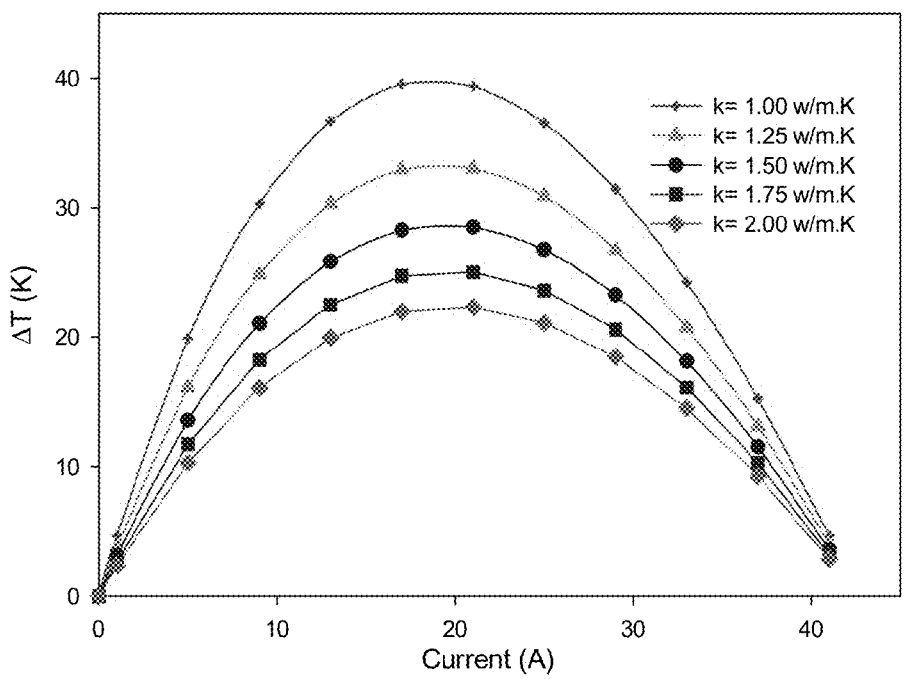
Figure 9. Contour of $\Delta T$ (K) vs. current (A) for $T_2$= 330 K, S = 435 µV/K, $\sigma$= 5.0×10$^3$ S.m$^{-1}$, L= 50 µm, A= 1.48×10$^{-6}$ m$^2$

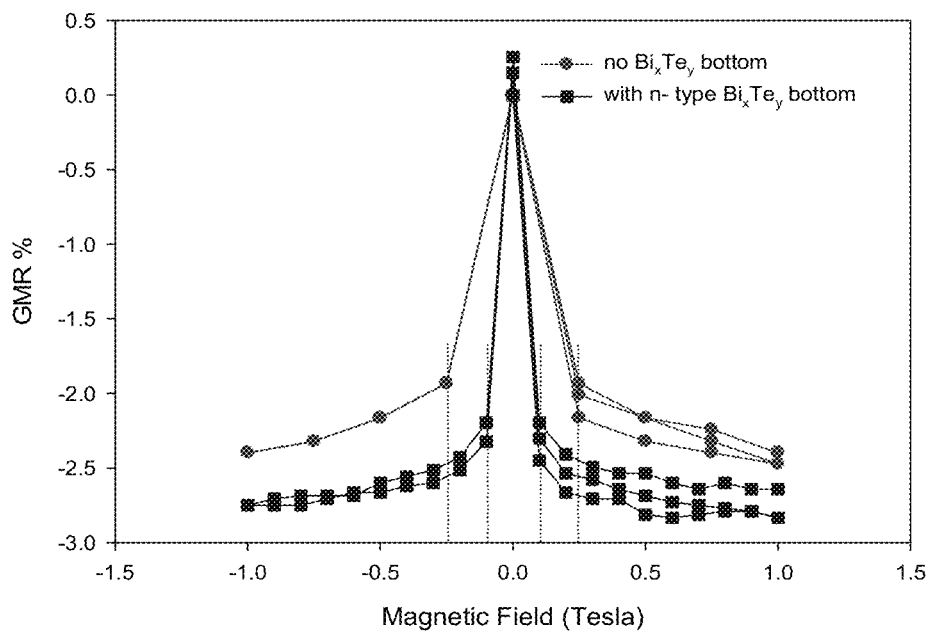
Figure 10. GMR measurements of CoNi/Cu GMR layered nanowires with and without $Bi_xTe_y$ cap.
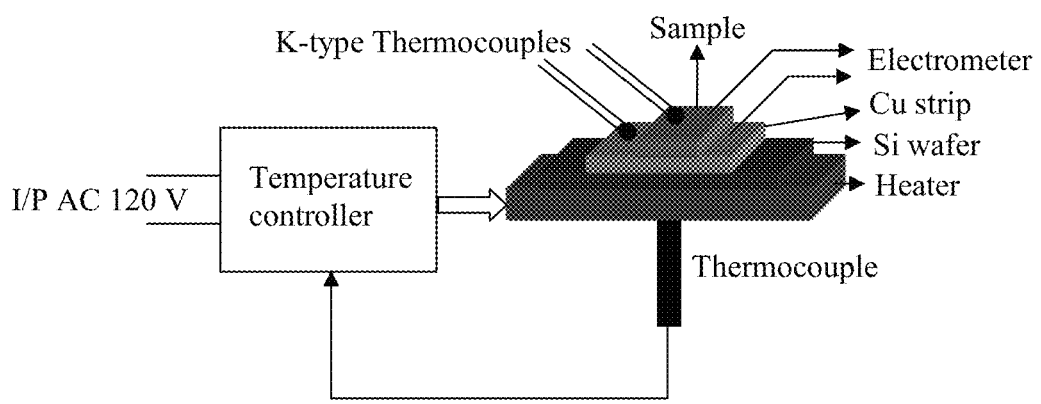
Figure 11. Seebeck coefficient measurement setup.

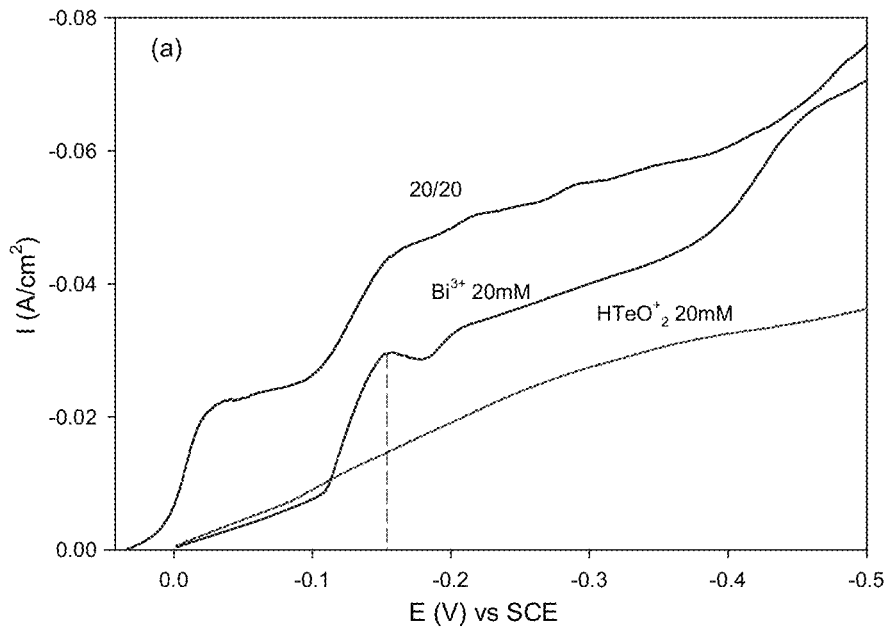
Figure 12a. Polarization curves of $HTeO^+_2$ (20Mm), $Bi^{3+}$ (20mM), combined (20/20) electrolytes at a scan rate of 5 mV/s.
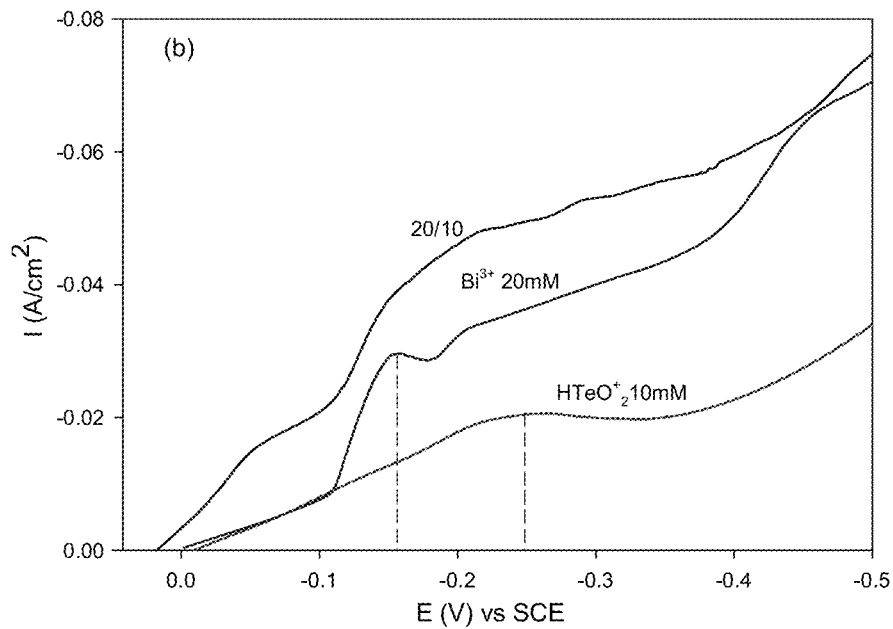
Figure 12b. Polarization curves of $HTeO^+_2$ (10Mm), $Bi^{3+}$ (20mM), combined (20/10) electrolytes at a scan rate of 5 mV/s.

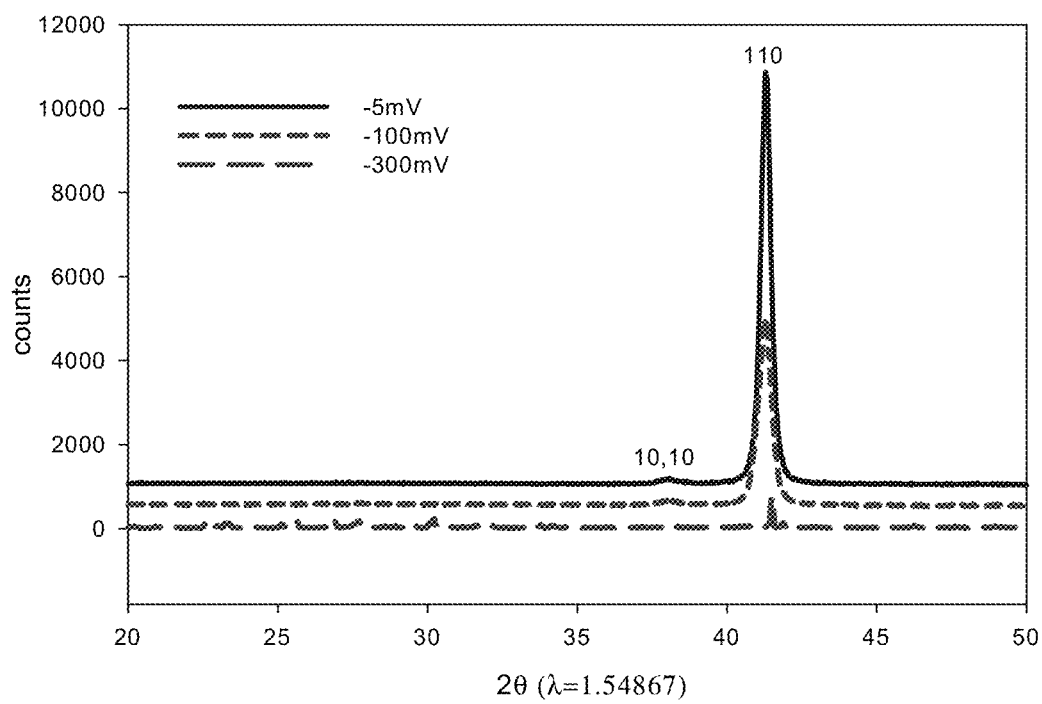
Figure 13. XRD of Bi$_x$Te$_y$ nanowires deposited in AAO membranes at different potentials from 20/20 electrolyte.

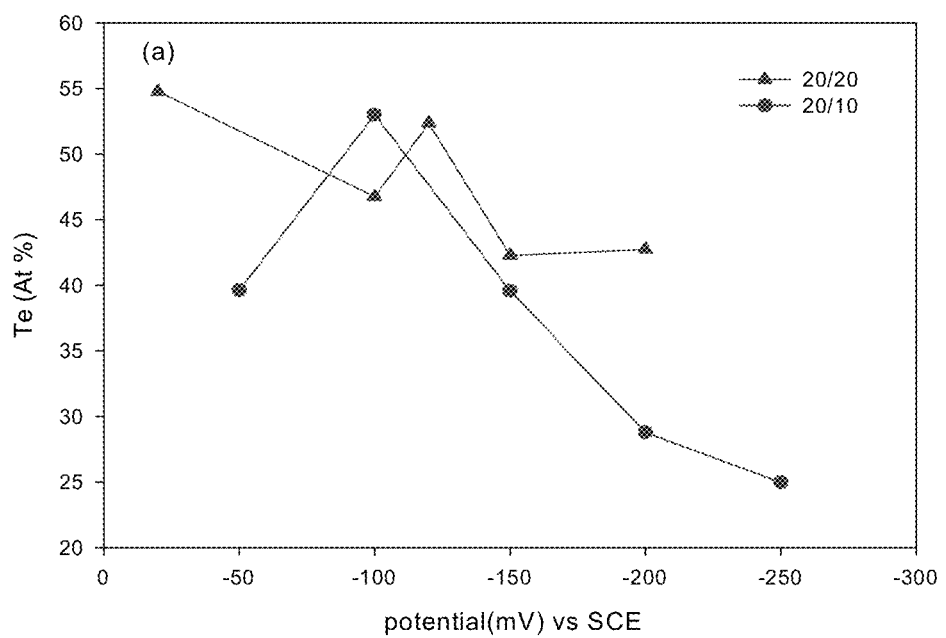
Figure 14. Variation of Te concentration with respect to deposition potentials for nanowires deposited in 20 nm pore size AAO membranes.

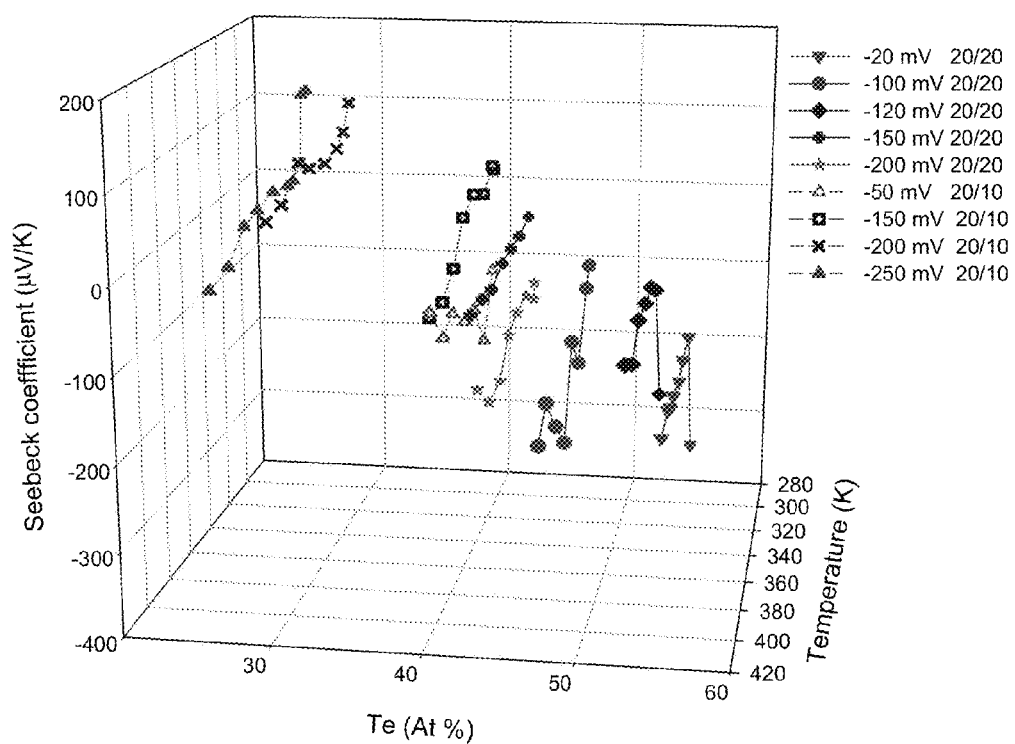
Figure 15. 3-D plot showing the variation of Seebeck coefficient with respect to tellurium concentration and temperature.

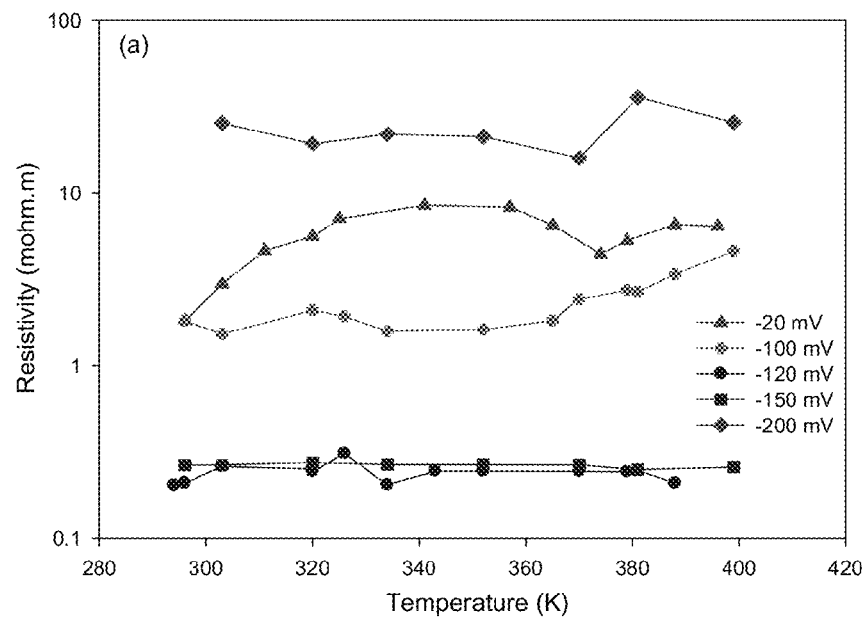
Figure 16a. Change in resistance with temperature for nanowire deposited from 20/20 electrolyte.
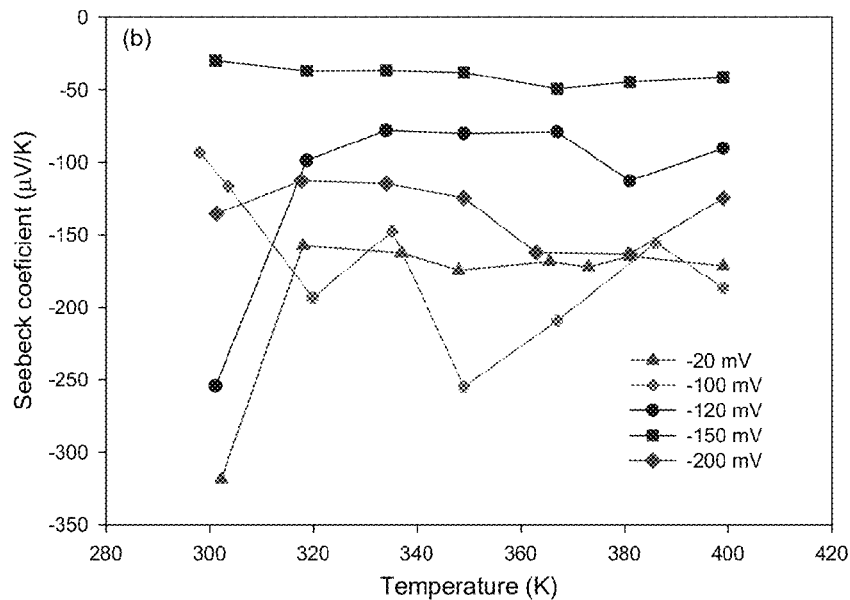
Figure 16b. Variation of Seebeck coefficient with temperature for nanowire deposited from 20/20 electrolyte.

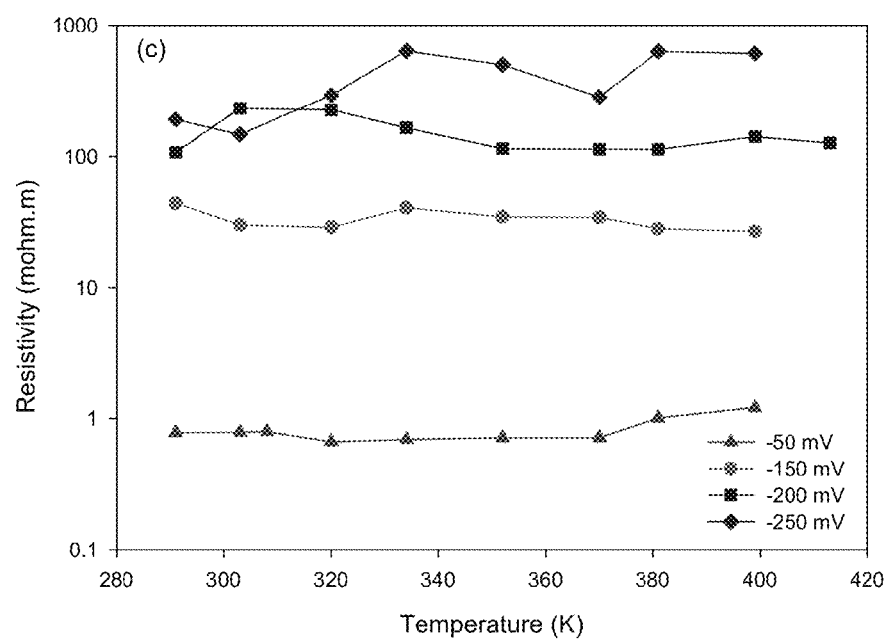
Figure 16c. Change in resistance with temperature for nanowire deposited from 20/10 electrolyte.

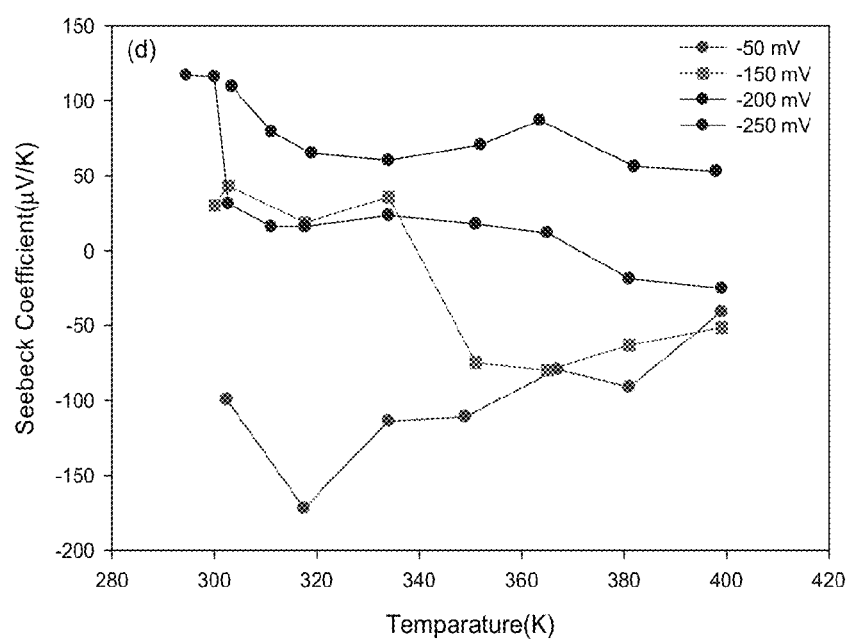
Figure 16d. Variation of Seebeck coefficient with temperature for nanowire deposited from 20/10 electrolyte.

_US 8,441,255 B1_

THERMOCOOLING OF GMR SENSORS

This application claims the benefit under 35 USC §119(e) of U.S. provisional application No. 61/146,579 filed Jan. 22, 2009, which is incorporated by reference herein in its entirety.

This invention was made at least in part with government support under contract no. NNX07AL03A awarded by NASA. The government may have certain rights in the invention.

I. BACKGROUND

A typical GMR device consists of at least two layers of ferromagnetic materials separated by a spacer layer. When the two magnetization vectors of the ferromagnetic layers are aligned, the electrical resistance will be lower (so a higher current flows at constant voltage) than if the ferromagnetic layers are anti-aligned. This constitutes a magnetic field sensor. Two variants of GMR have been applied in devices: (1) current-in-plane (CIP), where the electric current flows parallel to the layers and (2) current-perpendicular-to-plane (CPP), where the electric current flows in a direction perpendicular to the layers.

II. BRIEF DESCRIPTION OF THE DRAWINGS

FIGS. 2a and 2b are polarization plots a BiSbTe solution and SbO$^+$ partial current.

FIG. 3 is a plot showing the stoichiometric Bi, Te, Sb ratios in the deposited alloy with respect to deposition potential vs SCE.

FIGS. 4a to 4c show measurements of (a) Seebeck coefficient, (b) electrical conductivity, and (c) power factor of BiSbTe nanowires with respect to temperature.

FIG. 5a shows a polarization plot of individual Bi$^{3+}$, HTeO$^{2+}$ and combined Bi$_x$Te$_Y$ electrolytes.

FIG. 5b shows the variation of Te concentration with deposition potential.

FIG. 6 shows an XRD of Bi$_x$Te$_y$ nanowires deposited in AAO membranes at different potentials.

FIG. 7 shows the Seebeck coefficient of Bi$_x$Te$_y$ thin films measured at various temperatures.

FIG. 8 shows the Seebeck coefficient variation with respect to Tellurium concentration and temperature.

FIG. 9 shows the contour of ΔT (K) vs. current (A)

FIG. 10 shows GMR measurements of CoNi/Cu GMR layered nanowires with and without Bi$_x$Te$_y$ cap.

FIG. 11 shows a Seebeck coefficient measurement setup.

FIGS. 12a and 12b show polarization curves.

FIG. 13 shows Bi$_x$Te$_y$ nanowires deposited in AAO membranes at different potentials.

FIG. 14 shows the variation of Te concentration with respect to deposition potentials.

FIG. 15 shows a 3-D plot of the variation of Seebeck coefficient with respect to tellurium concentration and temperature.

FIG. 16a shows the change in resistance with temperature for a nanowire.

FIG. 16b shows the variation of Seebeck coefficient with temperature for a nanowire.

FIG. 16c shows the change in resistance with temperature for a nanowire.

FIG. 16d shows the variation of Seebeck coefficient with temperature for a nanowire.

III. DETAILED DESCRIPTION OF SELECTED EMBODIMENTS

Figure 1:
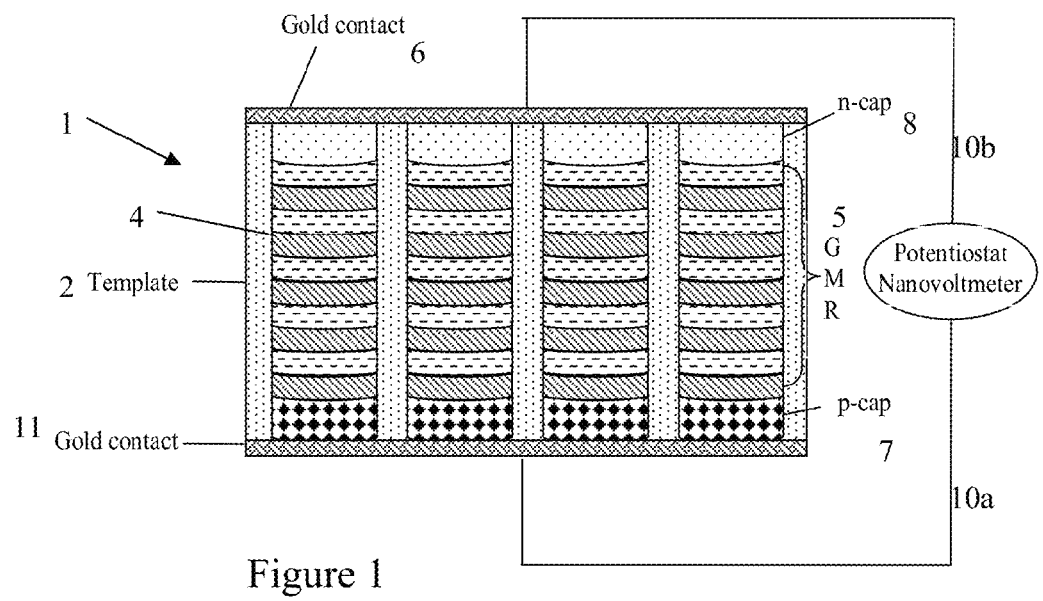
FIG. 1 illustrates one embodiment of a GMR sensor of the present invention.

FIG. 1 illustrates one example of a thermoelectrically cooled GMR sensor 1 constructed according to the present invention. GMR sensor 1 is generally constructed of a template 2 having a series of pores formed therein and GMR nanowires 4 deposited into the pores. Template 2 will typically be formed from a nonconductive material, two examples of which are anodized alumina and polycarbonate film. In FIG. 1, template 2 is a section of polycarbonate with pores formed therein. In FIG. 1, a gold layer 11 has been sputtered onto the bottom of template 2 and gold layer 11 will serve as the conductive base allowing electro-deposition of materials into the pores. The first layer deposited into the pores will be an p-type thermoelectric semiconductor material 7. In one example, the first layer of thermoelectric material will be a Bi$_x$Te$_y$ compound. Examples of thermoelectric compounds could include Bi$_1$Te$_1$, Bi$_2$Te$_3$, Bi$_3$Te$_2$, Bi$_7$Te$_3$, Bi$_4$Te$_1$, BiSbTe, BiSeTe, BiTe, Pb$_x$Te$_y$, CdxTe$_y$, Si$_x$Ge$_y$, Co$_x$Sb$_y$, CsBi$_x$Te$_y$, AgPb$_x$SbTe$_y$, Zn$_x$Sb$_y$Yb$_x$Co$_y$Sb$_z$, CeFeCoSb, Bi$_{0.5}$Sb$_{1.5}$Te$_3$, or Bi$_2$Sb$_{0.3}$Te$_{2.7}$. However, the thermoelectric layers could be any thermoelectric semiconductor, metal, metallic, or semi-metal material.

Following deposition of the first thermoelectric layer, a series of magnetic/non-magnetic layers will be deposited in order to form GMR section 5. In two examples, the GMR layers are either CoNi/Cu layers or CoNiFe/Cu layers. Other alternating layers could include Co/Cu, CoNiCu/Cu, or other layers providing a GMR effect.

After deposition of the GMR section 5, a second thermoelectric layer 8 is deposited on the nanowires. In this example, thermoelectric layer 8 may be a n-type Bi$_x$Te$_y$ compound as described above. A top layer 6 is formed across the nanowires. In one example, top layer 6 is a continuous layer of the n-type Bi$_x$Te$_y$ compound. In other examples, top layer 6 could be a conductive metal such as Cu or Au. As an alternative (not shown in FIG. 1) bottom layer 11 could further include a layer of Cu which can act as a heatsink. Wires or conductive strips 10a and 10b will be electrically connected to the n-type thermoelectric layer 8 and the p-type thermoelectric layer 7, respectively. In the example of FIG. 1, the wires/conductive strips 10a and 10b will connect to a potentiostat/nanovoltmeter.

It will be understood that in the normal operation of the GMR sensor, the varying resistance of the GMR material is detected by a current flowing through the GMR layers. However, because this current is also flowing through the thermoelectric layers, a thermoelectric cooling effect will simultaneously take place. In the example of FIG. 1, the bottom p-type layers 7 will accumulate heat from the GMR layers as a result of the thermoelectric cooling. The heat in bottom p-type layers 7 is then transferred to bottom layer 3 and will be dissipated in any conventional manner.

Alternate Embodiments

Another embodiment of the invention comprises a method of forming a thermoelectrically cooled GMR sensor. This method includes the steps of: (a) electrodepositing a first thermoelectric layer comprising one of either a p-type material or an n-type material onto a template having a plurality of pores; (b) electrodepositing onto the template over the first thermoelectric layer a plurality of alternating layers of magnetic and non-magnetic materials in order to form a GMR assembly; (c) electrodepositing a second thermoelectric layer of either p-type or an n-type material (whichever type was not deposited in step (a)) on the template over the GMR assembly; and then (d) depositing conductive layers in electrical contact with the thermoelectric layers. In one variation of this embodiment, a 20/10 (Bi/Te ratio in mM) electrolyte solution was employed and p-type nanowires were obtained by depositing at an electropotential of about −200 mV to −250 mV and n-type nanowires were obtained by depositing at an electro-potential of about −50 mV to −150 mV. In alternative variation of this embodiment, a 20/20 (Bi/Te ratio in mM) electrolyte solution was employed and n-type nanowires were obtained by depositing at an electro-potential of about −50 mV to −200 mV.

Another embodiment forms the thermo-electric layers from bismuth antimony telluride (BiSbTe) nanowires, which are electrodeposited at constant potentials into polycarbonate templates from a tartaric-nitric acid electrolyte. A $Bi_2Sb_{0.6}Te_{2.9}$ nanowire sample deposited at −150 mV, shows a high Seebeck coefficient (S) value of −630 µV/K and a electrical conductivity ($\sigma$) of $1.14 \times 10^5$ (ohm·m)$^{-1}$ at 300 K, resulting in a high power factor ($S^2\sigma$) of $4.5 \times 10^{-2}$ Wm$^{-1}$K$^{-2}$ for BiTe alloy family. With the available data on thermal conductivity (1-4 Wm$^{-1}$K$^{-1}$) of these nanomaterials, the electrodeposited $Bi_2Sb_{0.6}Te_{2.9}$ nanowires are goods candidates for achieving a desirable figure of merit (ZT>3) for thermoelectric materials. This figure of merit is defined as ZT=$S^2\sigma$T/k where, S is the Seebeck coefficient, $\sigma$ is electrical conductivity, T is the absolute temperature, k is thermal conductivity.

A further embodiment (Embodiment A) is a thermoelectrically cooled micro-device comprising (a) a first thermo-electric layer comprising an array of nanowires, wherein the nanowires include a diameter of about 1 nanometer to about 1000 nanometers; (b) a microdevice positioned over the first thermoelectric layer; (c) a second thermoelectric layer positioned over the micro-device and extending the nanowires, such that the nanowires have a length of between about 100 nanometers and about 500 microns; and (d) conductors in contact with the first and second thermoelectric layers for connecting the thermoelectric layers to a voltage source. This Embodiment A further includes the micro-device being a device for measuring at least one parameter of GMR, current, magnetic flux density, or displacement.

Another embodiment (Embodiment B) is a method of forming a thermoelectrically cooled GMR sensor comprising the steps of: (a) electrodepositing a first thermoelectric layer comprising one of a p-type material or an n-type material onto a template having a plurality of pores, the pores having a size ranging from 5 nm to 5000 nm; (b) electrodepositing onto the template over the first thermoelectric layer a plurality of alternating layers of magnetic and non-magnetic materials in order to form a GMR assembly; (c) electrodepositing a second thermoelectric layer comprising the other of a p-type or an n-type material on the template over the GMR assembly; (d) depositing conductive layers in electrical contact with the thermoelectric layers; and (e) dissolving the template to release the GMR assembly and thermoelectric layers.

Variations of this Embodiment B include (i) wherein the alternating layers of magnetic and non-magnetic materials comprise at least one of Co/Cu, CoNi/Cu, CoNiCu/Cu, or CoNiFeCu/Cu; (ii) wherein the thermoelectric layers are at least one of: BiSbTe, BiSeTe, BiTe, $Pb_xTe_y$, $CdxTe_y$, $Si_xGe_y$, $Co_xSb_y$, $CsBi_xTe_y$, $AgPb_xSbTe_y$, $Zn_xSb_yYb_xCo_ySb_z$, or CeFeCoSb; (iii) wherein depositing the GMR assembly comprises depositing at least about 500 alternating layers; (iv) wherein a template area over which the first thermoelectric layer is deposited is between about 0.01 um$^2$ and about 1 mm$^2$; (v) wherein the template has a thickness of between about 2 um and about 2000 um; and (vi) wherein the template has a thickness of between about 200 um and about 2000 um. A further variation of Embodiment B is where the p-type material is deposited from a solution having a Te concentration of less than about 30% and the n-type material is deposited from a solution having a Te concentration between about 30% and about 50%. Another variation of Embodiment B is where the solution from which the p-type material is deposited includes Bi, Sb, and Te (e.g., 0.5 mM $Bi_2O_3$, 1.5 mM $Sb_2O_3$ and 3 mM $TeO_2$, 1 M $HNO_3$, 0.2 M Tartaric acid.) and the solution from which the n-type material is deposited includes Bi, Se, and Te (e.g., 2 mM $Bi_2O_3$, 0.5 mM $Se_2O_3$ and 2.7 mM $TeO_2$, 1 M $HNO_3$). In this example embodiment, p-type material was deposited at −200 mV and has the formulation $Bi_{0.5}Sb_{1.5}Te_3$ and the n-type material was deposited at −20 mV and has the formulation $Bi_2Se_{0.3}Te_{2.7}$.

Another embodiment (Embodiment C) is method of forming a thermoelectrically cooled GMR sensor comprising the steps of: (a) forming a first thermoelectric layer comprising one of a p-type material or an n-type material onto a template having a plurality of pores, the pores having a size ranging from 5 nm to 5000 nm; (b) forming onto the template over the first thermoelectric layer a plurality of alternating layers of magnetic and non-magnetic materials in order to form a GMR assembly; (c) forming a second thermoelectric layer comprising the other of a p-type or an n-type material on the template over the GMR assembly; (d) forming conductive layers in electrical contact with the thermoelectric layers; and (e) dissolving the template to release the GMR assembly and thermoelectric layers. A variation of this Embodiment C is where the thermoelectric and GMR layers are formed through electro-deposition.

It will be understood that FIG. 1 illustrates merely one example of the thermoelectrically cooled GMR sensor of the present invention. Many alternative thermoelectric materials or GMR materials could be employed. Although FIG. 1 utilizes nano-needle structures, nano-tube structures, thin/flat structures or other shaped structures could also be utilized.

Additionally, the present invention may be used for conventional cooling such as refrigerators, seat cooler in automobiles, etc. The same nanowires may be integrated in a series or parallel architecture so that the required cooling powers can be obtained for the applications, i.e. the dimensions of the nanowires will remain the same and the number of these wires will increase to match the load requirements. These variations and many further variations should be considered as falling within the scope of the present invention.

IV. EXPERIMENTAL EXAMPLES

1. Example One

BiSbTe nanowires were electrodeposited into polycarbonate membranes using a Solatron 1287 function generator at constant potentials and room temperature from a tartaric-nitric acid base electrolyte. Being difficult to dissolve, $Sb_2O_3$ was treated with tartaric acid as a complexing agent to increase its solubility in water, and the obtained solution was mixed with a separately prepared $Bi_2O_3$ and $TeO_2$ electrolyte dissolved in $HNO_3$, followed by the addition of deionized (DI) water to make the final composition of 2.5 mM $Bi^{3+}$, 5 mM $SbO^+$, 10 mM $TeO_2$, 0.2 M tartaric acid, and 1M $HNO_3$. The reference and counter electrodes were Saturated Calomel Electrode (SCE) and a platinum (99.99%) mesh connected to a platinum wire, respectively. A 60 nm thick Au layer was sputtered on commercially available 50 nm pore size polycarbonate (Whatman) templates to deposit the nanostructures. Polycarbonate (PC) membranes (6 μm thickness, $6\times10^8$ pores/cm$^2$), have lower thermal conductivity compared to alumina membranes making them more effective for nanowire based devices. The obtained electrodeposited nanostructures embedded in the template, were separated by dissolving the polycarbonate using dichloromethane (Alfa Aesar) followed by rinsing with DI water several times, before imaging the with SEM (Hitachi S4800). Qualitative and quantitative composition analysis was obtained using EDS (Hitachi 4800). The Micromanipulator 916776 electrical probe station with a tip contacting diameter 10 μm was used to make precise contacts on the samples for electrical measurements.[20] Resistance and the voltage of the samples were measured using Kiethley 236 and 6514 (±10 μV to ±210 V) electrometers, respectively. A Cu strip was used as a reference for voltage measurements, while an Omega K-type thermocouple was used to measure temperature.

FIG. 2 shows the polarization curves of the individual $Bi^{3+}$, $HTeO_2^+$, $SbO^+$ and their combined electrolyte. The goal of this analysis is to identify suitable deposition potentials to obtain BiSbTe alloys with different compositions. In the individual electrolytes, $HTeO_2^+$ current is higher than the $Bi^{3+}$ current (FIG. 2a), which is consistent with the fact that $HTeO_2^+$ had a higher concentration (10 mM) than the $Bi^{3+}$ (2.5 M), and their respective limiting currents were reached at −115 mV and −90 mV. Compared to the partial currents of the more noble metals $Bi^{3+}$ and $HTeO_2^+$, $SbO^+$ partial current (FIG. 2b) is very low (−0.2 to −0.4 mA/cm$^2$) for potentials less than −500 mV, and it was found to increase only at higher deposition potentials. This is consistent with the earlier reports showing higher reduction potentials for $SbO^+$. Two minor limiting currents were observed for $SbO^+$ reduction at −70 mV and −250 mV, corresponding to the hydrogen evolution potentials of individual $Bi^{3+}$ and $HTeO_2^+$ components.

The polarization plot of the combined electrolyte can be divided in to three reduction regions $R_1$, $R_2$, and $R_3$. In the deposition regions $R_1$ and $R_2$ extending from 0 to −70 mV, and −70 to −180 mV, respectively, the combined electrolyte current is equal to the sum of the individual currents. For low deposit potentials in the region $R_1$ the alloy current has a major contribution from the more noble elements $Bi^{3+}$ and $HTeO_2^+$, which is justified by the composition analysis shown in FIG. 3. Antimony deposition was not observed at a low potential of −20 mV and stoichiometric $Bi_2Te_3$ alloy nanowires were then obtained. Further increase in the deposition potential to −50 mV induced the reduction of antimony. A two step reduction process, with the initial reduction of $HTeO_2^+$ to Te, followed by the further reduction of Te to more stable $Bi_2Te_3$ characterizes this electrodeposition window.

The reduction of all three elements was observed in the region $R_2$ forming different BiSbTe alloy combinations. Indicating the individual $Bi^{3+}$ and $HTeO_2^+$ components, two limiting currents were observed at −100 mV and −125 mV; however, the negative shift in the reduction potentials in the combined electrolyte, compared to the individual components, contradicts the positive shift observed in the BiTe electrolytes. This behavior can be attributed to the formation of antimony-tartaric acid complex cations which tend to shift the reduction potentials to more negative values. Concentration of antimony in the deposited alloy remained relatively constant for depositions in the $R_2$ region, therefore obtaining stoichiometric $Bi_2Sb_{0.66}Te_{3.4}$ and $Bi_2Sb_{0.6}Te_{2.9}$ at −100 mV and −150 mV, respectively. An overall third limiting current was observed in the $R_3$ region, while the composition analysis of the nanowires sample deposited at −200 mV and −250 mV shows a further increase in the antimony composition forming Sb rich alloys. In the $R_3$ region reduction starts with the formation of $H_2Te$ from $HTeO_2^+$, followed by the electrochemical reaction of $H_2Te$ with $Bi^{3+}$ and $SbO^+$, to form BiSbTe alloys.[16] In the overall deposition range analyzed (−20 mV to −250 mV), Bi concentration remained comparatively constant, while Te concentration decreased and antimony content increased with potential.

SEM images were made of the nanowires in the background of dissolved polycarbonate template, deposited at −150 mV. Even though the template pore diameter is 50 nm, the SEM analysis shows that the nanowires have larger diameter of (110 nm±5 nm standard deviation), which indicates the bulging of the nanowires in the pores during the electrodeposition process. Fully grown nanowires having different alloy compositions, deposited at −20 mV, −100 mV, −150 mV, −200 mV, and −250 mV, were chosen for thermoelectric characterization.

FIG. 4a shows the Seebeck coefficients of BiSbTe nanowires. All the measured samples showed a decreasing trend in Seebeck coefficients with temperature and the negative values indicate their n-type behavior. The highest Seebeck coefficient of −630 μV/K was obtained at 300 K for nanowire sample electrodeposited at a potential of −150 mV. Antimony rich nanowires deposited at potentials −200 mV and −250 mV exhibited lower Seebeck coefficients of −244 μV/K and −325 μV/K at 375 K; however, even these lower nanowires values are higher than their bulk counterparts.[23] Variation of electrical conductivity of the nanowires samples with temperature is illustrated in FIG. 4b. A semiconducting behavior was indicated by the increase in conductivity at low temperatures with a high value of, $1.14\times10^5$ (ohm·m)$^{-1}$ at 300 K, for the −150 mV sample, while the antimony rich sample obtained at high deposition potential (−250 mV) showed the lowest conductivity of $9.2\times10^3$ (ohm·m)$^{-1}$. FIG. 4c illustrates the behavior of nanowire's power factor ($S^2\sigma$). The highest room temperature power factor of $4.5\times10^{-2}$ Wm$^{-1}$K$^{-2}$ was obtained for nanowires sample deposited at −150 mV, while the lowest room temperature power factor of $4.0\times10^{-3}$ Wm$^{-1}$K$^{-2}$ was obtained for −250 mV sample. Relating to the composition of the nanowires, the highest $S^2\sigma$ was calculated for $Bi_2Sb_{0.6}Te_{2.9}$ nanowire sample deposited at −150 mV. The higher power factor for these nanowires compared to their bulk counterparts is mainly due to the improved contribution from Seebeck coefficients.

The antimony content in the BiSb alloys has a major influence on the nanowire diameter at which a semimetal to semiconductor transition can be observed, which is due to the increased distance between the electron and hole subbands. Compared to the diameter (<50 nm) for bismuth nanowires, addition of antimony increases the diameter at which this transition could be observed, meaning that even the larger diameter BiSb alloy wires, with an optimum antimony composition, can exhibit a semiconducting behavior resulting in higher Seebeck coefficients. The same phenomenon can be attributed to the high Seebeck coefficients achieved in $Bi_2Sb_{0.6}Te_{2.9}$ nanowires, which have the antimony atomic percentage of 11 and the nanowire diameter of 110 nm, values close to optimum antimony percentage and wire diameter predicted to for BiSb nanowires. Addition of antimony also induces the external carriers, increasing the conductivity of nanowires deposited at −100 mV and −150 mV. However, further increase in the antimony concentration at high deposition potential (−200 mV, −250 mV) could increase the band gap energies, decreasing the conductivity of nanowires. Nanowire thermal conductivity was found to be lower than their bulk counter parts due to the boundary scattering. Assuming that the thermal conductivity of BiSbTe is in the same range as the measured BiTe nanowires (1-4 Wm$^{-1}$K$^{-1}$), the Bi$_2$Sb$_{0.6}$Te$_{2.9}$ nanowire samples can achieve a ZT>3.

2. Example Two

Electrodeposition was used to fabricate the thin films, nanowires, and GMR layers. Bi$_x$Te$_y$ nanowires and thin films were deposited from 1M HNO$_3$ solution containing 20 mM BiO$_2$ and 20 mM TeO$_2$. The reference and counter electrodes were Saturated Calomel Electrode (SCE) and a platinum (99.99%) mesh, respectively. Copper foil was used as the cathode substrate for thin films, while Au:Pd (60:40) sputtered polycarbonate (PC) or alumina (AAO) templates were used to make the nanostructures. GMR layers were obtained from an aqueous solution containing 25 mM NiSO$_4$, 50 mM CoSO$_4$, and 1 mM CuSO$_4$ using a pulse potential technique. Electrodeposition was carried out using Solatron 1287 function generator. Optimized deposition potentials were estimated from the polarization curves. The electrodeposited nanowires, thin films and GMR layered structures with Bi$_x$Te$_y$ caps were imaged and studied using SEM (Hitachi S4800) and TEM (JEOL JEM 2010). Quantitative composition analysis was obtained using EDS (Hitachi 4800). Crystal structure of the thin films and nanowires were studied using XRD (Cu Kα radiation). The Micromanipulator 916776 electrical probe station with a tip contacting radius ranging from 1 to 35 μm was used to make precise contacts on the samples for electrical measurements. Voltage across the sample was measured using Keithley 6514 Electrometer (±10 μV to ±210V). An Omega K-type thermocouple was used for temperature measurements. An in-house built PID controlled electrical heater was used to provide accurate and uniform heat distribution for Seebeck measurements.

FIG. 5a shows the polarization plots obtained at a scan rate of 10 mV/sec for individual 7.5 mM Bi$^{3+}$, 10 mM HTeO$^{2+}$ and mixed Bi$_x$Te$_y$ electrolytes. At low deposition potentials below −50 mV the overall current in the mixed Bi$_x$Te$_y$ electrolyte is less than the individual Bi$^{3+}$ current and almost equal to HTeO$^{2+}$ current, suggesting that in the low potential region a Te-rich alloy should be obtained. The Te concentration plot in FIG. 5b shows that a higher Te concentration was obtained in this deposition region (below −50 mV), implying a preferential Te deposition at low overpotentials. As the deposition potential increases, the already reduced Te influences the reduction of Bi. FIG. 5a shows that at a deposition potential of −100 mV the individual Bi current suddenly increases, which is in agreement with the composition analysis (FIG. 5b) showing a Bi-rich (60%) alloy at this potential. Further increasing the deposition potential resulted in even lower Te concentrations: 30% Te at −150 mV and 20% Te at −300 mV.

SEM images were made of thin films electrodeposited at various constant potentials. Stoichiometric Bi$_2$Te$_3$, Bi$_3$Te$_2$, Bi$_7$Te$_3$, Bi$_4$Te$_1$ compositions were obtained at −50 mV, −100 mV, −150 mV, and −300 mV, respectively. Significant variations in film morphology were observed for minor compositional changes. The Te-rich sample deposited at −50 mV, showed a needle-like morphology, while a fine granular structure was observed for Bi-rich samples deposited at −100 mV. As the deposition potential increased, the granular structure disappeared and a flowery-like Bi-rich structures were obtained at −300 mV.

Nanowires were deposited in porous Alumina (AAO) and Polycarbonate (PC) membranes. Nanowires were obtained from low (−5 mV) to high (−300 mV) overpotentials using different pore size membranes: 20 nm to 100 nm in diameter and 6 μm to 60 μm in length. SEM images were taken of an example of Bi$_x$Te$_y$ alloy nanowires deposited in 20 nm pore diameter AAO membrane at −100 mV and another SEM image showed an example of Bi$_x$Te$_y$ alloy nanowires deposited in 50 nm pore diameter PC membrane at −300 mV. No significant H$_2$ evolution causing tubular structures was observed in the studied potential range, consequently well formed nanowires were obtained in these pore sizes. A TEM image was taken of a CoNi/Cu GMR layered nanowire electrodeposited in a PC membrane with a p-type Bi$_x$Te$_y$ thermoelectric cap at the top. The imaged structure had a n-type bottom layer deposited at −50 mV followed by 500 bilayers (magnetic CoNi alternating with nonmagnetic Cu layers) and a p-type top deposited at −250 mV. Details about GMR deposition are provided in ref. (15).

FIG. 6 shows the XRD phase analysis of the nanowires deposited in AAO membrane at various potentials −5 mV, −100 mV, −300 mV. All the nanowire samples show a preferential (110) orientation. Particularly, nanowires deposited at −5 mV exhibit a good crystalline nature showing a strong (110) peak. However the intensity of (110) peak decreased for nanowires deposited at higher overpotentials (−100 mV) and then vanished for the sample deposited at even higher overpotentials (−300 mV), when the nanowires became amorphous. Rapid deposition rate at high overpotential is the reason for the Bi$_x$Te$_y$ nanowire crystalline to amorphous phase transition. Therefore, low deposition potentials lead to good crystalline samples while high deposition potentials lead to amorphous counterparts.

FIG. 6 shows the Seebeck coefficients of the thin films deposited at −100 mV, −150 mV, −300 mV. A maximum Seebeck coefficient of −200 μV/K was obtained at 345K for a thin film deposited at an intermediate deposition potential of −150 mV. This intermediate deposition potential inducing polycrystallinity could be the reason for this high Seebeck coefficient. The thin films obtained at a lower negative deposition potential (−100 mV) showed lower Seebeck coefficients, which could be related to the higher electrical conductivity of a better crystalline structure. However the amorphous nature of the thin film deposited at −300 mV might be the reason for its low Seebeck coefficient. Additional electrical, thermal conductivity and crystal structure data is required for further analysis.

Bi$_x$Te$_y$ thin films and nanowires were electrodeposited potentiostatically in a wide deposition range, −5 mV to −300 mV. Te induced Bi deposition was confirmed from composition analysis. The Te concentration in the electrodeposited thin films decreased with increased deposition potential. A needle-like structure was observed for Te-rich films deposited at low overpotentials while a flowery type structure was observed for Bi-rich samples deposited at high overpotentials. Fully grown Bi$_x$Te$_y$ nanowires were obtained from low to high overpotentials and their XRD revealed a crystalline to amorphous transition as a function of deposition potential. A maximum Seebeck coefficient of −200 μV/K was obtained for a thin film deposited at −150 mV.

3. Example Three

Potentiostatic electrodeposition was used to fabricate Bi$_x$Te$_y$ nanowires and GMR layers. Bi$_x$Te$_y$ nanowires were deposited from two different aqueous acidic electrolytes prepared using Alfa Aesar Bi$_2$O$_3$ (99.50%), TeO$_2$ (99.99%) powders, and aqueous HNO$_3$ (70%) purchased from Sol-1 and sol-2 are 2.5M HNO$_3$ electrolytes containing 20 mM Bi$^{3+}$ 20 mM HTeO$_2^+$ and 20 mM Bi$^{3+}$ 10 mM HTeO$_2^+$, respectively. GMR layers were obtained from an aqueous solution containing 25 mM NiSO$_4$, 50 mM CoSO$_4$, and 1 mM CuSO$_4$ using a pulsed potential technique. The reference and counter electrodes were Saturated Calomel Electrode (SCE) and a platinum (99.99%) mesh, respectively. Au:Pd (60:40) sputtered alumina (AAO) templates were used to electrodeposit the nanostructures. Electrodeposition was carried out using Solatron 1287 function generator.

Optimized deposition potentials were estimated from the polarization curves (5 mV/sec). The electrodeposited nanowires and GMR layered structures with $Bi_xTe_y$ caps were imaged and studied using SEM (Hitachi 54800) and TEM (JEOL JEM 2010). Quantitative composition analysis was obtained using EDS (Hitachi 4800). The Micromanipulator 916776 electrical probe station with a tip contacting radius ranging from 1 to 35 μm was used to make precise contacts on the samples for electrical measurements. Voltage across the sample was measured using Keithley 6514 Electrometer (±10 μV to ±210 V). An Omega K-type thermocouple was used for temperature measurements. An in-house built PID controlled electrical heater was used to provide accurate and uniform heat distribution for Seebeck measurements. GMR was measured using a Hall measurement system (Lakeshore 665) that can sweep magnetic field from −1 T to 1 T at room temperature, in a four probe resistance method.

FIG. 8 shows the variation of nanowire Seebeck coefficient with respect to Te concentration and temperature. All the nanowires deposited from sol-1 showed n-type characteristics. The highest Seebeck coefficient of −318.7 μV/K was obtained for nanowires deposited at −20 mV, while p-type nanowires were obtained from Bi-rich electrolyte (sol-2) for higher deposition potentials (>−150 mV). The highest p-type Seebeck coefficient of 117 μV/K was obtained for nanowires deposited at −200 mV from sol-2. It can be seen that at low Te concentrations (<30%) p-type nanowires were obtained, while n-type nanowires were obtained at high Te concentrations (>30%). Since Te acts as donor atom in $Bi_xTe_y$, increased Te concentrations positively affected Seebeck coefficients of n-type nanowires. Conversely, higher carrier concentrations resulting from high Te content (>50%) negatively affected Seebeck coefficients because of the improved electrical conductivity.

FIG. 9 shows the maximum cooling contour plot obtained using equation [1], for different thermal conductivities, $$\Delta T(I) = \frac{IL(2A\sigma ST_2 - IL)}{2A\sigma(Ak + ISL)} \quad [1]$$

where ΔT is the temperature difference, I is the current applied, S is the Seebeck coefficient, σ is the electrical conductivity, k is the thermal conductivity, T is the absolute temperature, A is contact area of the sample, and L is the length of nanowire. It can be seen that ΔT across the sample decreases with increasing thermal conductivity and a maximum ΔT of 39.5 K can be obtained for a current of 17 A. Initially, ΔT increases with increased current, however, at higher currents ΔT starts decreasing due to Joule heating contribution ($I^2$ term) in equation [1].

The GMR nanowires with $Bi_xTe_y$ cap deposited in porous alumina (AAO) template were imaged, including a TEM image of a CoNi/Cu GMR layered nanowire and a cross sectional SEM image of the GMR nanowires with a $Bi_xTe_y$ bottom. N-type (Te-rich) $Bi_xTe_y$ bottom was deposited at a deposition potential of −20 mV followed by 2000 GMR bilayers (magnetic CoNi alternating with nonmagnetic Cu layers) and a Cu top. Thickness of the $Bi_xTe_y$ bottom was measured to be 14±0.5 μm.

FIG. 10 shows the GMR measurements of the nanowires with and with-out $Bi_xTe_y$ bottom. For comparison purpose GMR deposition conditions and number of layers were kept constant for both samples. The magnetic saturation fields for the compared samples show a difference of 0.15 T at room temperature. The $Bi_xTe_y$ capped sample showed increase in GMR from −2.4 to −2.8% and saturates at lower magnetic field (0.1 T) compared to the sample without $Bi_xTe_y$ bottom.

The highest Seebeck coefficients of −318.7 μV/K and 117 μV/K were measured for n-type and p-type nanowires deposited at −20 mV and −250 mV from two different electrolytes. P-type nanowires were obtained at low Te concentrations (<30%). Increased Te content positively affected Seebeck coefficients of n-type nanowires. Conversely, high Te content (>50%) negatively affected the nanowire Seebeck coefficient due to higher carrier concentrations. The magnetic saturation of GMR of nanowires was improved due to local thermoelectric cooling provided by $Bi_xTe_y$ caps.

4. Example Four

Bismuth telluride nanowires were electrodeposited at room temperature and constant potentials from two different electrolytes: The 20/20, which contains 20 mM $Bi_2O_3$, 20 mM $TeO_2$, and the 20/10, which contains 20 mM $Bi_2O_3$, 10 mM $TeO_2$. Both the electrolytes were dissolved completely using 2.5 M $HNO_3$, $Bi_2O_3$ and $TeO_2$ dissolve as $Bi^{3+}$ and $HTeO_2^+$ in acidic medium. All the chemicals were obtained from Alfa Aesar. The reference and counter electrodes were Saturated Calomel Electrode (SCE) and a platinum (99.99%) mesh, respectively. 60 nm thick Au:Pd (60:40) was sputtered on commercially available 20 nm (manufacturer specifications) pore size AAO (whatman) template to deposit the nanostructures. Electrodeposition was carried out using Solatron 1287 function generator. Optimized deposition potentials were estimated from the polarization curves obtained at a scan rate of 5 mV/s. The obtained electrodeposited nanowires were dissolved using KOH and rinsed with deionized water (DI) several times before imaging with SEM (Hitachi S4800). Qualitative and quantitative composition analysis was obtained using EDS (Hitachi 4800). Crystal structure of the nanowires was studied using XRD (Cu Kα radiation, collected at CAMD). The Micromanipulator 916776 electrical probe station with a tip contacting diameter ranging from 1 to 50 μm was used to make precise contacts on the samples for electrical measurements. FIG. 11 shows the schematic of the setup used for measuring Seebeck coefficient and resistance of electrodeposited samples. Voltage across the sample was measured using a Keithley 6514 Electrometer (±10 μV to ±210 V). A Cu strip was used as a reference for voltage measurements. Electrical isolation of the samples was provided by a 2 μm oxide layer Silicon wafer. An Omega K-type thermocouple was used for temperature measurements. Accurate and uniform heat distribution for Seebeck measurements was provided by proportional-integral-derivative (PID) controlled-electrical heater obtained from Love controls.

FIG. 12 shows the polarization behavior of the two studied combined electrolytes the 20/20, the 20/10, and their individual counterparts. FIG. 12*a* illustrates the overall current profile of the 20/20 combined electrolyte, in which two distinct mass transport regions could be identified corresponding to the bismuth and tellurium components. From the partial current profiles the bismuth limiting current was reached at −150 mV. The overall current profile in the 20/20 combined electrolyte shows a shift toward the more noble potential region. FIG. 12*b* shows the overall current of the 20/10 electrolyte and their partial currents. In this case the individual tellurium limiting current was observed at −250 mV. The overall current profile in the 20/10 case maintained the same behavioral trend as the 20/20 electrolyte, noticing a negative shift in limiting current potentials.

The current behavior in the 20 mM $Bi^{3+}$ individual solution showed a limiting value of −29 mA/cm$^2$ at −150 mV. In the individual electrolyte solutions, the $HTeO_2^+$ component limiting current was observed for low concentrations indicating a diffusion effect. For 20 mM $HTeO_2^+$ no clear limiting current was observed, while a limiting current density of −20.6 mA/cm$^2$ was observed at −250 mV for 10 mM $HTeO_2^+$. The equilibrium reduction potential of the combined electrolyte was found to be more positive compared to the individual electrolytes due to the mutually induced codeposition mechanism. Addition of Te in the combined electrolyte shifted reduction potentials to more positive region. For instance, the reduction potential for combined electrolyte with 10 mM $HTeO_2^+$ plus 20 mM $Bi^{3+}$ (20/20) starts at 19 mV, while for 20 mM $HTeO_2^+$ plus 20 mM $Bi^{3+}$ (20/10) electrolyte starts at 34 mV. To be noted that the current in the combined electrolytes follows a similar trend in $Bi^{3+}$ individual electrolyte. A limiting current was observed in the combined electrolyte when the individual kinetic region Bi current is less than the Te counterpart.

FIG. 13 shows XRD pattern of the nanowires deposited in AAO membrane at potentials −5 mV, −100 mV, and −300 mV from the 20/20 electrolyte. The nanowires deposited at −5 mV and −100 mV show a preferential (110) orientation, indicating that nanowires are polycrystalline with c-axis almost parallel to the nanowire length. However, the intensity of (110) peak decreased for nanowires deposited at higher overpotentials (−100 mV) and the (110) peak was strongly diminished for the sample deposited at even higher overpotential (−300 mV). Crystallite size calculations using the Scherer equation in JADE™ showed crystallite sizes of 210 Å, 150 Å, and 950 Å for nanowires deposited at −5 mV, −100 mV, and −300 mV, respectively. The XRD data suggests that the crystallite size is directly proportional to the deposition potential; higher the deposition potential larger the crystallite size.

FIG. 14 includes the solid state characterization of nanowires obtained from 20/20, 20/10 combined electrolytes. FIG. 14 shows the composition analysis of the nanowires deposited from 20/20 and 20/10 electrolytes, respectively. An overall decrease in Te composition was observed for all the nanowires deposited in the −50 to −250 mV potential region. Exceptions were noted at −100 mV, −120 mV, where a spike in Te concentration was observed. The spike in the Te concentration can be explained by the changes in contributions of the partial tellurium current in the kinetic region. The corresponding cross-sectional SEM images of the nanowires deposited from 20/20 electrolyte at −120 mV and from 20/10 electrolyte at −100 mV were made. From the SEM images it could be concluded that high density, bamboo shaped nanowires were obtained. Nanowires deposited from the Bi-rich electrolyte (20/10) have a lower Te concentrations than the nanowires electrodeposited from 20/10 electrolyte, serving as a proof of principle to the concept that the bismuth telluride alloy composition can be controlled by either changing the deposition potential or by changing the electrolyte concentration.

FIG. 15 shows the variation of Seebeck coefficient with respect to Te concentration and temperature for nanowires obtained from 20/20 and 20/10 electrolytes. It can be seen that at low Te concentrations (<30%) p-type nanowires were obtained, while n-type nanowires were obtained at high Te concentrations (>30%). Since Te acts as donor atom in bismuth telluride, increase in Te concentration beyond 30% resulted in obtaining n-type nanowires. Initially, increased Te concentrations positively affected Seebeck coefficients of n-type nanowires. Conversely, higher electron carrier concentrations resulting from high Te content (>47%) negatively affected Seebeck coefficients because of the improved electrical conductivity. Seebeck coefficient strongly depends on electrical conductivity: high electrical conductivity leads to a higher thermal conductivity decreasing the temperature difference (ΔT) across the nanowires, which in turn decreases the generated voltage, lowering the Seebeck coefficient. Samples obtained from the equimolar $Bi^{3+}$ and $HTeO_2^+$ (20/20) electrolyte showed dominant n-type behavior, while samples obtained from the Bi-rich electrolyte showed p-type behavior at high deposition potentials.

FIG. 16 shows the electrical characterization of nanowires obtained form 20/20 and 20/10 electrolyte. FIG. 16a illustrates the electrical resistivity as a function of temperature for nanowires obtained form 20/20 electrolyte for different deposition potentials. The lowest resistive nanowires were obtained at −120 mV and the highest resistive nanowires were obtained at a higher overpotential of −200 mV. FIG. 16b shows the nanowire Seebeck coefficients as a function of temperature for different deposition potentials. The highest n-type Seebeck coefficient of −318 µV/K was obtained for nanowires deposited at −20 mV. The lowest n-type Seebeck coefficient of −30 µV/K was obtained for nanowires deposited at higher negative overpotentials (−150 mV). Following the explanation for the dependence of electrical conductivity on Seebeck coefficient, the low electrical resistive nanowires showed lower Seebeck coefficients. Nanowires deposited at −20 mV and −100 mV have higher electrical resistivities contributing to higher Seebeck coefficients. All the nanowires deposited form 20/20 electrolyte showed negative Seebeck coefficients, indicating that these are n-type in nature.

FIG. 16c shows the electrical resistivity of nanowires obtained from 20/10 electrolyte as a function of temperature for different deposition potentials. It can be observed that nanowire electrical resistivity increased with increasing deposition potential. The lowest resistive nanowires were obtained at −50 mV and the highest resistive nanowires were obtained at a higher deposition potential of −250 mV. FIG. 16d shows the Seebeck coefficients as a function of temperature for nanowires deposited at different deposition potentials from 20/10 electrolyte. Both n and p-type nanowires were obtained from the 20/10 electrolyte. The highest p-type Seebeck coefficient of 117 µV/K was measured for nanowires deposited at a high overpotential of −250 mV. The n-type Seebeck coefficient of −172 µV/K was obtained for nanowires deposited at a low deposition potential of −50 mV. The nanowire temperature influenced the p to n-type transition for structures deposited at −150 mV and −250 mV. Initially for low temperatures p-type behavior was observed while n-type behavior was observed for temperatures above 360 K, which is a result of intrinsic to extrinsic transition of the nanowires. At high temperatures electrons which were the minority carriers, get sufficient energy to transition to the conduction band and become majority carriers leading to n-type behavior. This increase in carrier concentration also reflected in the resistance measurements of the same samples. A significant decrease in resistivity due to higher carrier concentrations was observed above 360 K confirming the intrinsic to extrinsic transition assumption.

The polarization behaviors of the two different ratio electrolytes considered (20/20 and 20/10) show a stronger dependence on the Bi concentration than on Te concentration. However, nanowires composition was found to be strongly dependent on both electrolyte concentration and on the deposition potentials. Fully grown bismuth telluride nanowires were obtained at low to high overpotentials, and their XRD revealed (110) orientation of the nanowires with c-axis parallel to the nanowires length. Nanowires deposited at high deposition potentials showed higher resistance. The highest n and p-type Seebeck coefficients of −318.7 μV/K, and 117 μV/K were measured for nanowire deposited at −20 mV, and −250 mV from 20/20, and 20/10 electrolytes respectively. P-type nanowires were obtained for Te concentrations lower than 30% and an increased n-type Seebeck coefficient was observed for increased Te concentration up to 47%, when the Seebeck coefficient starts decreasing because of increased electrical conductivity.

We claim:

1. A thermoelectrically cooled GMR sensor comprising:
   a. a first thermoelectric layer comprising an array of nanowires, wherein the nanowires include a diameter of about 1 nanometer to about 1000 nanometers;
   b. a plurality of alternating layers of magnetic and nonmagnetic material positioned over and extending the nanowires to form a GMR assembly;
   c. a second thermoelectric layer positioned over the GMR assembly and extending the nanowires, such that the nanowires have a length of between about 100 nanometers and about 500 microns; and
   d. conductors in contact with the first and second thermoelectric layers for connecting the thermoelectric layers to a voltage source.

2. The GMR sensor of claim 1, wherein the nanowire diameters are between about 20 nanometers to about 100 nanometers and the nanowire lengths are between about 5 microns to and about 60 microns.

3. The GMR sensor of claim 1, further comprising at least 500 alternating layers of magnetic and nonmagnetic material.

4. The GMR sensor of claim 3, further comprising between about 2000 and about 2500 alternating layers of magnetic and nonmagnetic material.

5. The GMR sensor of claim 1, wherein said GMR assembly is positioned directly on said first thermoelectric layer and said second thermoelectric layer is positioned directly on said GMR assembly.

6. The GMR sensor of claim 1, wherein a cross-sectional area of the layers forming the array of nanowires is about 0.001 $nm^2$ to about 1 $mm^2$.

7. The GMR sensor of claim 1, wherein the array of nanowires has a needle density of about $10^5$ to $10^{10}$ wires/$cm^2$.

8. The GMR sensor of claim 1, wherein the nanowires have an aspect ratio (length/diameter) of at least about 1000.

9. The GMR sensor of claim 1, wherein the thermoelectric layers consist essentially of $Bi_xTe_y$ compounds.

10. The GMR sensor of claim 1, wherein the diameter of the nanowires have a tolerance of between about 1 nm.

11. The GMR sensor of claim 1, wherein the diameter of the nanowires have a tolerance of less than about 5 nm.

12. A method of forming a thermoelectrically cooled GMR sensor comprising the steps of:
   a. electrodepositing a first thermoelectric layer comprising one of a p-type material or an n-type material from a first solution containing Bi, Sb, and Te under a first set of conditions;
   b. electrodepositing onto the first thermoelectric layer a plurality of alternating layers of magnetic and non-magnetic materials in order to form a GMR assembly;
   c. electrodepositing a second thermoelectric layer comprising the other of a p-type or an n-type material on the GMR assembly from the first solution under a second set of conditions; and
   d. forming conductive layers in electrical contact with the thermoelectric layers.

13. The method of claim 12, wherein an electropotential applied during deposition of the p-type material is about −100 to about −350 mV and an electropotential applied during deposition of the n-type material is about −20 to −200 mV.

14. The method of claim 12, wherein the electrodeposition steps are carried out at approximately standard (ambient) temperature and pressure.

15. The method of claim 13, wherein the first solution further includes Sb and the p-type material has the formulation $Bi_{0.5}Sb_{1.5}Te_3$ and the n-type material has the formulation $Bi_2Sb_{0.3}Te_{2.7}$.

16. The method of claim 12, wherein the first thermoelectric layer is formed on a template having apertures of exposed conductive material ranging from 10 nm to 500 um.

17. The method of claim 16, wherein the template is between 1 um and 500 um in thickness.

18. The method of claim 12, wherein the deposition is carried out at any sub-range between −1 mV and about −400 mV.

19. The method of claim 12, wherein the electropotential applied during deposition of the p-type material is a first negative value and the electropotential applied during deposition of the n-type material is a second negative value less than said first value.

* * * * *